(12) United States Patent
Hizume

(10) Patent No.: US 10,779,406 B2
(45) Date of Patent: Sep. 15, 2020

(54) WIRING SUBSTRATE

(71) Applicant: SHINKO ELECTRIC INDUSTRIES CO., LTD., Nagano (JP)

(72) Inventor: Toru Hizume, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/274,447

(22) Filed: Feb. 13, 2019

(65) Prior Publication Data

US 2019/0261513 A1 Aug. 22, 2019

(30) Foreign Application Priority Data

Feb. 21, 2018 (JP) .................. 2018-028500

(51) Int. Cl.
| | |
|---|---|
| H05K 1/00 | (2006.01) |
| H05K 1/16 | (2006.01) |
| H05K 3/00 | (2006.01) |
| H05K 3/32 | (2006.01) |
| H01L 21/02 | (2006.01) |
| H01L 21/44 | (2006.01) |
| H01L 21/48 | (2006.01) |

(Continued)

(52) U.S. Cl.
CPC ........... H05K 1/115 (2013.01); H05K 1/0271 (2013.01); H05K 1/185 (2013.01); *H01L 23/49822* (2013.01)

(58) Field of Classification Search
CPC .. H05K 1/00; H05K 1/16; H05K 3/00; H05K 3/32; H01L 21/02; H01L 21/44; H01L 21/48; H01L 21/50; H01L 23/00; H01L 23/48; H01L 23/52; H01L 23/498

USPC .............. 174/260, 250, 251, 257, 258, 261; 361/761, 763, 764, 689; 257/E21.001, 257/E21.499, E21.5, E21.502, E21.507, 257/E21.585, E21.705, E23.004, E23.019, 257/E23.062, E23.069, E23.077, E23.079, 257/E23.114, E23.172, E23.174, 659, 257/685, 690, 698, 700, 723, 724, 737, 257/734, 773

See application file for complete search history.

(56) References Cited

U.S. PATENT DOCUMENTS

| | | | |
|---|---|---|---|
| 6,876,554 B1 * | 4/2005 | Inagaki | H01G 4/224 361/763 |
| 9,627,309 B2 | 4/2017 | Kobayashi et al. | |

(Continued)

FOREIGN PATENT DOCUMENTS

| | | |
|---|---|---|
| JP | 2016-096292 | 5/2016 |
| JP | 2016-207958 | 12/2016 |

*Primary Examiner* — Xiaoliang Chen
(74) *Attorney, Agent, or Firm* — IPUSA, PLLC

(57) ABSTRACT

A wiring substrate includes a first insulating layer, an electronic component, a resin layer, a second insulating layer, a wiring pattern, and a via interconnect. The first insulating layer includes a cavity. The electronic component includes a first surface at which a pad is formed and a second surface facing away from the first surface and fixed in the cavity via an adhesive layer. The resin layer is on the first surface of the electronic component and covers the pad. The second insulating layer is on the first insulating layer and covers the resin layer. The wiring pattern is on the second insulating layer. The via interconnect pierces through the second insulating layer and the resin layer to electrically connect the wiring pattern to the pad.

5 Claims, 5 Drawing Sheets

(51) Int. Cl.
  *H01L 21/50* (2006.01)
  *H01L 23/00* (2006.01)
  *H01L 23/48* (2006.01)
  *H01L 23/52* (2006.01)
  *H01L 23/498* (2006.01)
  *H05K 1/11* (2006.01)
  *H05K 1/02* (2006.01)
  *H05K 1/18* (2006.01)

(56) References Cited

U.S. PATENT DOCUMENTS

| | | | |
|---|---|---|---|
| 10,049,972 B2 | 8/2018 | Kurita | |
| 10,312,195 B2* | 6/2019 | Lee | H01L 23/5389 |
| 2003/0015342 A1* | 1/2003 | Sakamoto | H01L 21/4846 |
| | | | 174/250 |
| 2003/0086679 A1* | 5/2003 | Gao | G02B 6/138 |
| | | | 385/143 |
| 2004/0014317 A1* | 1/2004 | Sakamoto | H01L 21/568 |
| | | | 438/689 |
| 2004/0160751 A1* | 8/2004 | Inagaki | H01L 21/4857 |
| | | | 361/763 |
| 2005/0112798 A1* | 5/2005 | Bjorbell | H01L 23/5385 |
| | | | 438/106 |
| 2005/0157478 A1* | 7/2005 | Inagaki | H01G 4/224 |
| | | | 361/763 |
| 2006/0003495 A1* | 1/2006 | Sunohara | H01L 21/4857 |
| | | | 438/124 |
| 2008/0007927 A1* | 1/2008 | Ito | H01L 23/49822 |
| | | | 361/764 |
| 2008/0153324 A1* | 6/2008 | Hsu | H01L 23/5389 |
| | | | 439/74 |
| 2008/0188037 A1* | 8/2008 | Lin | H01L 21/4846 |
| | | | 438/108 |
| 2008/0211083 A1* | 9/2008 | Kang | H01L 24/19 |
| | | | 257/700 |
| 2008/0277776 A1* | 11/2008 | Enomoto | H01L 21/486 |
| | | | 257/700 |
| 2009/0026636 A1* | 1/2009 | Murai | H01L 23/5389 |
| | | | 257/782 |
| 2009/0065245 A1* | 3/2009 | Hsu | H01L 23/49822 |
| | | | 174/260 |
| 2009/0237900 A1* | 9/2009 | Origuchi | H01L 23/49838 |
| | | | 361/763 |
| 2009/0242252 A1* | 10/2009 | Tanaka | H01L 23/5389 |
| | | | 174/260 |
| 2009/0244865 A1* | 10/2009 | Tanaka | H01L 23/5389 |
| | | | 361/764 |
| 2010/0044845 A1* | 2/2010 | Funaya | H01L 21/6835 |
| | | | 257/685 |
| 2010/0212946 A1* | 8/2010 | Shimizu | H01L 23/5384 |
| | | | 174/261 |
| 2010/0213616 A1* | 8/2010 | Uchiyama | H01L 21/563 |
| | | | 257/773 |
| 2010/0224397 A1* | 9/2010 | Shimizu | H01L 23/5384 |
| | | | 174/260 |
| 2010/0308452 A1* | 12/2010 | Iihola | H01L 23/5389 |
| | | | 257/692 |
| 2011/0127656 A1* | 6/2011 | Kobayashi | H01L 21/6835 |
| | | | 257/666 |
| 2011/0155433 A1* | 6/2011 | Funaya | H01L 23/49827 |
| | | | 174/258 |
| 2011/0193203 A1* | 8/2011 | Goto | H01L 23/5389 |
| | | | 257/659 |
| 2012/0227261 A1* | 9/2012 | Inui | H05K 1/186 |
| | | | 29/849 |
| 2013/0183800 A1* | 7/2013 | Hsu | H01L 23/49822 |
| | | | 438/118 |
| 2013/0292826 A1* | 11/2013 | Lin | H01L 21/50 |
| | | | 257/737 |
| 2013/0307113 A1* | 11/2013 | Kunimoto | H01L 23/49827 |
| | | | 257/528 |
| 2013/0337648 A1* | 12/2013 | Lin | H01L 21/486 |
| | | | 438/675 |
| 2013/0341784 A1* | 12/2013 | Lin | H01L 24/19 |
| | | | 257/737 |
| 2014/0070396 A1* | 3/2014 | Kyozuka | H01L 24/19 |
| | | | 257/698 |
| 2014/0091454 A1* | 4/2014 | Lin | H01L 24/96 |
| | | | 257/734 |
| 2014/0191406 A1* | 7/2014 | Takashita | H01L 21/561 |
| | | | 257/773 |
| 2015/0001708 A1* | 1/2015 | Lin | H01L 23/49811 |
| | | | 257/737 |
| 2015/0016079 A1* | 1/2015 | Furutani | H05K 1/185 |
| | | | 361/763 |
| 2015/0034374 A1* | 2/2015 | Shimizu | H05K 1/187 |
| | | | 174/257 |
| 2015/0043183 A1* | 2/2015 | Ishiguro | H05K 1/185 |
| | | | 361/761 |
| 2015/0062848 A1* | 3/2015 | Lee | H05K 1/0271 |
| | | | 361/761 |
| 2016/0118333 A1* | 4/2016 | Lin | H01L 24/97 |
| | | | 257/773 |
| 2016/0141236 A1* | 5/2016 | Kurita | H01L 23/49822 |
| | | | 361/761 |
| 2016/0307847 A1* | 10/2016 | Lee | H01L 23/5389 |
| 2016/0322295 A1* | 11/2016 | Kobayashi | H01L 23/49838 |
| 2017/0133309 A1* | 5/2017 | Kim | H01L 23/5389 |
| 2017/0154838 A1* | 6/2017 | Kim | H01L 21/486 |
| 2017/0278812 A1* | 9/2017 | Lee | H01L 23/3114 |
| 2017/0345864 A1* | 11/2017 | Kinsman | H01L 21/4853 |
| 2017/0365566 A1* | 12/2017 | Lee | H01L 23/3114 |
| 2017/0372995 A1* | 12/2017 | Kim | H01L 23/49838 |
| 2017/0373035 A1* | 12/2017 | Seol | H01L 24/25 |
| 2018/0076156 A1* | 3/2018 | Kim | H01L 23/293 |
| 2018/0082933 A1* | 3/2018 | Ko | H01L 24/20 |
| 2018/0082962 A1* | 3/2018 | Lee | H01L 23/3128 |
| 2018/0090402 A1* | 3/2018 | Kim | H01L 24/19 |
| 2018/0096968 A1* | 4/2018 | Lee | H01L 24/19 |
| 2018/0102322 A1* | 4/2018 | Kang | H01L 23/5389 |
| 2018/0138127 A1* | 5/2018 | Lee | H01L 23/5389 |
| 2018/0145036 A1* | 5/2018 | Kim | H01L 24/20 |
| 2018/0174974 A1* | 6/2018 | Kim | H01L 23/5389 |
| 2018/0174994 A1* | 6/2018 | Choi | H01L 21/76802 |
| 2019/0035758 A1* | 1/2019 | Hwang | H01L 24/25 |

\* cited by examiner

WIRING SUBSTRATE

CROSS-REFERENCE TO RELATED APPLICATION

This application is based upon and claims the benefit of priority of the prior Japanese Patent Application No. 2018-028500, filed on Feb. 21, 2018, the entire contents of which are incorporated herein by reference.

FIELD

A certain aspect of the embodiment discussed herein is related to wiring substrates.

BACKGROUND

Conventionally, a wiring substrate in which an electronic component is installed in a cavity of a first insulating layer via an adhesive layer is known. Such a wiring substrate includes, for example, a second insulating layer formed on the first insulating layer to cover the electronic component and a wiring pattern formed on an upper surface of the second insulating layer. The wiring pattern is electrically connected to a pad of the electronic component via a via hole formed in the second insulating layer. See, for example, Japanese Laid-open Patent Publication Nos. 2016-096292 and 2016-207958 for related art.

SUMMARY

According to an aspect of the present invention, a wiring substrate includes a first insulating layer, an electronic component, a resin layer, a second insulating layer, a wiring pattern, and a via interconnect. The first insulating layer includes a cavity. The electronic component includes a first surface at which a pad is formed and a second surface facing away from the first surface and fixed in the cavity via an adhesive layer. The resin layer is on the first surface of the electronic component and covers the pad. The second insulating layer is on the first insulating layer and covers the resin layer. The wiring pattern is on the second insulating layer. The via interconnect pierces through the second insulating layer and the resin layer to electrically connect the wiring pattern to the pad.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
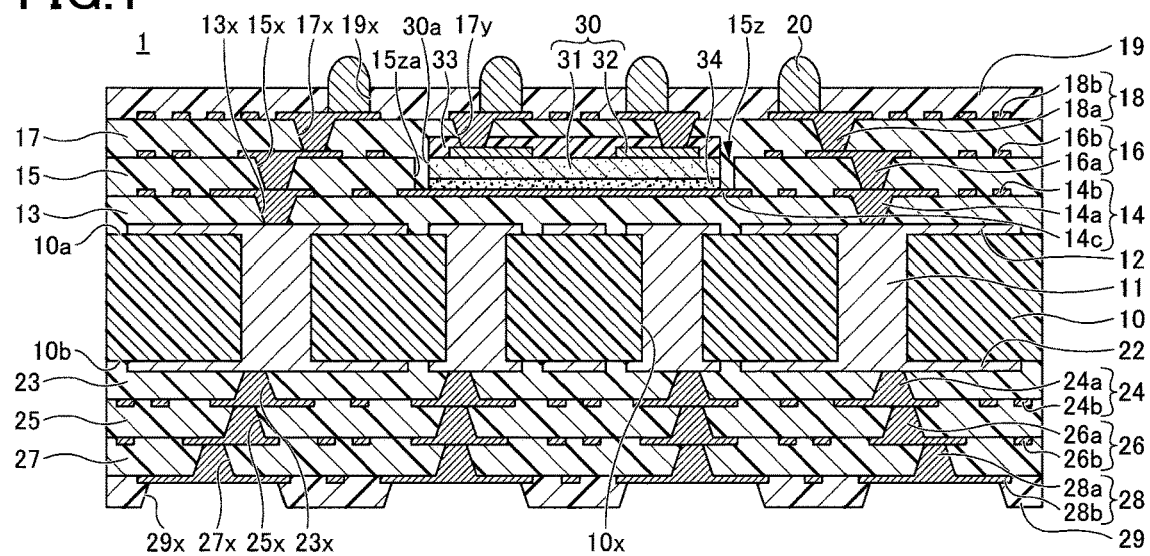
FIG. 1 is a sectional view of a wiring substrate according to an embodiment.

According to the related-art wiring substrate as described above, the electronic component may be heated to warp convexly during the manufacturing process of the wiring substrate because common electronic components have a lower coefficient of thermal expansion than the adhesive layer. When the electronic component warps convexly, part of the second insulating layer covering the electronic component becomes thinnest in the center and thicker toward the periphery on the electronic component.

When via holes are formed in the second insulating layer in this state, the depth of a via hole increases and the bottom area of a via hole (the area of a pad of the electronic component exposed at the bottom of a via hole) decreases as the thickness of the second insulating layer increases. As a result, the reliability of connection of the wiring pattern formed on the upper surface of the second insulating layer and the pad of the electronic component through the via hole is lower as the via hole is closer to the periphery on the electronic component.

According to an aspect of the present invention, in a wiring substrate in which an electronic component is installed, it is possible to improve the reliability of connection of a wiring pattern formed on an upper surface of an insulating layer covering the electronic component and a pad of the electronic component through a via hole.

A preferred embodiment of the present invention will be explained with reference to accompanying drawings. In the following, the same elements or components are referred to using the same reference numeral, and duplicate description thereof may be omitted.

[Structure of Wiring Substrate]

First, a structure of a wiring substrate according to an embodiment is described. FIG. 1 is a sectional view of a wiring substrate 1 according to the embodiment. Referring to FIG. 1, the wiring substrate 1 includes a core layer 10 and wiring layers and insulating layers stacked on each side of the core layer 10. An electronic component 30 is buried in the wiring substrate 1 on one side of the core layer 10.

Specifically, the wiring substrate 1 includes a wiring layer 12, an insulating layer 13, a wiring layer 14, an insulating layer 15, a wiring layer 16, an insulating layer 17, a wiring layer 18, and a solder resist layer 19, which are stacked in sequence on a first surface 10a of the core layer 10. Furthermore, the wiring substrate 1 includes a wiring layer 22, an insulating layer 23, a wiring layer 24, an insulating layer 25, a wiring layer 26, an insulating layer 27, a wiring layer 28, and a solder resist layer 29, which are stacked in sequence on a second surface 10b of the core layer 10.

According to this embodiment, for convenience of description, the solder resist layer 19 side of the wiring substrate 1 is referred to as "upper side" or "first side," and the solder resist layer 29 side of the wiring substrate 1 is referred to as "lower side" or "second side." Furthermore, with respect to each part or element of the wiring substrate 1, a surface on the solder resist layer 19 side is referred to as "upper surface" or "first surface," and a surface on the solder resist layer 29 side is referred to as "lower surface" or "second surface." The wiring substrate 1, however, may be used in an inverted position or oriented at any angle. Furthermore, a plan view refers to a view of an object taken in a direction normal to the first surface 10a of the core layer 10, and a planar shape refers to the shape of an object viewed in a direction normal to the first surface 10a of the core layer 10.

Examples of the core layer 10 include a so-called glass epoxy substrate having glass cloth impregnated with an insulating resin such as an epoxy resin or a polyimide resin and a substrate having a woven or non-woven fabric of glass fibers, carbon fibers, or aramid fibers impregnated with an epoxy resin. The thickness of the core layer 10 may be, for example, approximately 60 μm to approximately 400 μm. Through holes 10x are formed through the core layer 10 in its thickness direction. The planar shape of the through holes 10x is, for example, circular.

The wiring layer 12 is formed on the first surface 10a of the core layer 10. The wiring layer 22 is formed on the second surface 10b of the core layer 10. The wiring layer 12 and the wiring layer 22 are electrically connected by through vias 11 formed in the through holes 10x. Each of the wiring layers 12 and 22 is patterned into a predetermined planar shape. Suitable materials for the wiring layers 12 and 22 and the through vias 11 include, for example, copper (Cu). The thickness of the wiring layers 12 and 22 may be, for example, approximately 10 μm to approximately 30 μm. The wiring layer 12, the wiring layer 22, and the through vias 11 may be formed together as one piece.

The insulating layer 13 is so formed on the first surface 10a of the core layer 10 as to cover the wiring layer 12. Suitable materials for the insulating layer 13 include, for example, an insulating resin whose principal component is an epoxy resin or a polyimide resin. The thickness of the insulating layer 13 may be, for example, approximately 30 μm to approximately 50 μm. The insulating layer 13 may contain a filler such as silica ($SiO_2$). The filler content of the insulating layer 13 may be suitably determined in accordance with a required coefficient of thermal expansion (CTE).

The wiring layer 14 is formed on the insulating layer 13 on its first side. The wiring layer 14 includes via interconnects 14a filling in via holes 13x piercing through the insulating layer 13 to expose the upper surface of the wiring layer 12; a wiring pattern 14b formed on the upper surface of the insulating layer 13; and an electronic component mounting pad 14c formed on the upper surface of the insulating layer 13. The wiring pattern 14b is electrically connected to the wiring layer 12 via the via interconnects 14a. The via holes 13x may be recesses having the shape of an inverted truncated cone, having an upper-side opening at the upper surface of the insulating layer 13 and a lower-side opening on the upper surface of the wiring layer 12. The upper-side opening is greater in diameter than the lower-side opening. The material of the wiring layer 14 and the thickness of the wiring pattern 14b and the electronic component mounting pad 14c may be equal to, for example, the material and the thickness, respectively, of the wiring layer 12.

The insulating layer 15 is so formed on the upper surface of the insulating layer 13 as to cover the wiring layer 14. The insulating layer 15 may be equal in material and thickness to, for example, the insulating layer 13. The insulating layer 15 may contain a filler such as silica. The filler content of the insulating layer 15 may be equal to, for example, the filler content of the insulating layer 13.

A cavity 15z is formed in the insulating layer 15 to expose the upper surface of the electronic component mounting pad 14c. The wiring layer 16 is not formed in a region of the insulating layer 15 where the cavity 15z is formed. That is, the cavity 15z is formed in a region of the insulating layer 15 where the wiring layer 16 is not formed. The planar shape of the cavity 15z may be suitably determined in accordance with the planar shape of the electronic component 30 placed in the cavity 15z. When the planar shape of the electronic component 30 is rectangular, the planar shape of the cavity 15z may be a rectangular shape slightly larger than the outer shape of the electronic component 30. Furthermore, for example, when the planar shape of the cavity 15z is rectangular, the planar shape of the electronic component mounting pad 14c may be a rectangular shape slightly larger than the outer shape of the cavity 15z. The outer shape of the electronic component 30 is, for example, approximately several millimeters square to approximately several dozen millimeters square.

The electronic component 30 including a body 31 and pads 32 formed on the upper surface of the body 31 is mounted on the upper surface of the electronic component mounting pad 14c exposed in the cavity 15z. The lower surface of the body 31 is fixed to the upper surface of the electronic component mounting pad 14c exposed in the cavity 15z via an adhesive layer 34. For example, the electronic component 30 may be mounted in the cavity 15z such that the body 31 protrudes upward relative to the upper surface of the insulating layer 15.

Examples of the electronic component 30 include a semiconductor chip and a capacitor. When the electronic component 30 is a semiconductor chip, the body 31 is, for example, silicon of approximately 50 μm to approximately 100 μm in thickness, and has a CTE of approximately 3 ppm/° C. The pads 32 are formed of, for example, copper.

A resin layer 33 covering the pads 32 is formed on the upper surface of the electronic component 30. The resin layer 33 is a warp correcting resin that prevents the warping of the electronic component 30. Suitable materials for the resin layer 33 include, for example, an insulating resin whose principal component is an epoxy resin or a polyimide resin. The thickness of the resin layer 33 may be, for example, approximately 30 μm to approximately 40 μm. The resin layer 33 may contain a filler such as silica.

The filler content of the resin layer 33 is preferably adjusted to be smaller than the filler content of the insulating layer 17. This makes the CTE of the resin layer 33 higher than the CTE of the insulating layer 17. For example, when the filler content of the insulating layer 17 is 80% to 90% and the CTE of the insulating layer 17 is 20 ppm/° C. to 50 ppm/° C., the filler content of the resin layer 33 may be adjusted to be less than 80% to make the CTE of the resin layer 33 greater than 50 ppm/° C. An optimum value may be selected as a specific adjusted value while determining the degree of warping of the electronic component 30.

Suitable materials for the adhesive layer 34 include, for example, an insulating adhesive agent whose principal component is an epoxy resin or a polyimide resin (for example, a die attach film). The thickness of the adhesive layer 34 may be, for example, approximately 5 μm to approximately 10 μm. The adhesive layer 34 may contain a filler such as silica. The filler content of the adhesive layer 34 may be suitably determined in accordance with a required CTE. For example, the filler content of the adhesive layer 34 may be 0% to 80%, and the CTE of the adhesive layer 34 may be 20 ppm/° C. to 100 ppm/° C.

The wiring layer 16 is formed on the insulating layer 15 on its first side. The wiring layer 16 includes via interconnects 16a filling in via holes 15x piercing through the insulating layer 15 to expose the upper surface of the wiring layer 14; and a wiring pattern 16b formed on the upper surface of the insulating layer 15. The wiring pattern 16b is electrically connected to the wiring pattern 14*b* via the via interconnects 16*a*. The via holes 15*x* may be recesses having the shape of an inverted truncated cone, having an upper-side opening at the upper surface of the insulating layer 15 and a lower-side opening on the upper surface of the wiring layer 14. The upper-side opening is greater in diameter than the lower-side opening. The material of the wiring layer 16 and the thickness of the wiring pattern 16*b* may be equal to, for example, the material and the thickness, respectively, of the wiring layer 12.

The insulating layer 17 is formed on the upper surface of the insulating layer 15, covering the electronic component 30 on which the resin layer 33 is formed and the wiring layer 16. Part of the insulating layer 17 fills in a gap formed between a sidewall (inner wall surface) 15*za* of the cavity 15*z* and a side surface 30*a* of the electronic component 30, and covers the sidewall 15*za* of the cavity 15*z*, the side surface 30*a* of the electronic component 30, and the upper surface of the electronic component mounting pad 14*c*. The insulating layer 17 may be equal in material and thickness to, for example, the insulating layer 13. The insulating layer 17 may contain a filler such as silica. The filler content of the insulating layer 17 may be equal to, for example, the filler content of the insulating layer 13.

The wiring layer 18 is formed on the insulating layer 17 on its first side. The wiring layer 18 includes via interconnects 18*a* filling in via holes 17*x* piercing through the insulating layer 17 to expose the upper surface of the wiring layer 16 or via holes 17*y* piercing through the insulating layer 17 and the resin layer 33 to expose the upper surfaces of the pads 32; and a wiring pattern 18*b* formed on the upper surface of the insulating layer 17. Part of the wiring pattern 18*b* is electrically connected to the wiring pattern 16*b* via the via interconnects 18*a* piercing through the insulating layer 17. Part of the wiring pattern 18*b* is electrically connected to the pads 32 via the via interconnects 18*a* piercing through the insulating layer 17 and the resin layer 33. The via holes 17*x* and 17*y* may be recesses having the shape of an inverted truncated cone, having an upper-side opening at the upper surface of the insulating layer 17 and a lower-side opening on the upper surface of the wiring layer 16 or the upper surface of the pad 32. The upper-side opening is greater in diameter than the lower-side opening. The material of the wiring layer 18 and the thickness of the wiring pattern 18*b* may be equal to, for example, the material and the thickness, respectively, of the wiring layer 12.

The solder resist layer 19 is the outermost layer of the wiring substrate 1 on its first side, and is so formed on the upper surface of the insulating layer 17 as to cover the wiring layer 18. The solder resist layer 19 may be formed of, for example, a photosensitive resin such as a photosensitive epoxy or acrylic resin. The thickness of the solder resist layer 19 may be, for example, approximately 15 μm to approximately 35 μm.

The solder resist layer 19 includes openings 19*x*, and the upper surface of the wiring layer 18 is partly exposed at the bottom of the openings 19*x*. The planar shape of the openings 19*x* may be, for example, circular. A metal layer may be formed or an anti-oxidation treatment such as an organic solderability preservative (OSP) process may be performed on the upper surface of the wiring layer 18 exposed in the openings 19*x* on an as-needed basis. Examples of metal layers include a gold (Au) layer, a Ni/Au layer (a laminated metal layer of a nickel [Ni] layer and a Au layer stacked in this order), and a Ni/Pd/Au layer (a laminated metal layer of a Ni layer, a palladium [Pd] layer, and a Au layer stacked in this order).

External connection terminals 20 are formed on the upper surface of the wiring layer 18 exposed at the bottom of the openings 19*x*. The external connection terminals 20 are, for example, solder bumps. Suitable materials for solder bumps include, for example, alloys containing lead (Pb), tin-copper (Sn—Cu) alloys, tin-silver (Sn—Ag) alloys, and tin-silver-copper (Sn—Ag—Cu) alloys. The external connection terminals 20 serve as terminals for electrically connecting to a semiconductor chip.

The insulating layer 23 is so formed on the second surface 10*b* of the core layer 10 as to cover the wiring layer 22. The insulating layer 23 may be equal in material and thickness to, for example, the insulating layer 13. The insulating layer 23 may contain a filler such as silica. The filler content of the insulating layer 23 may be equal to, for example, the filler content of the insulating layer 13.

The wiring layer 24 is formed on the insulating layer 23 on its second side. The wiring layer 24 includes via interconnects 24*a* filling in via holes 23*x* piercing through the insulating layer 23 to expose the lower surface of the wiring layer 22; and a wiring pattern 24*b* formed on the lower surface of the insulating layer 23. The wiring pattern 24*b* is electrically connected to the wiring layer 22 via the via interconnects 24*a*. The via holes 23*x* may be recesses having the shape of a truncated cone, having an upper-side opening on the lower surface of the wiring layer 22 and a lower-side opening at the lower surface of the insulating layer 23. The lower-side opening is greater in diameter than the upper-side opening. The material of the wiring layer 24 and the thickness of the wiring pattern 24*b* may be equal to, for example, the material and the thickness, respectively, of the wiring layer 12.

The insulating layer 25 is so formed on the lower surface of the insulating layer 23 as to cover the wiring layer 24. The insulating layer 25 may be equal in material and thickness to, for example, the insulating layer 13. The insulating layer 25 may contain a filler such as silica. The filler content of the insulating layer 25 may be equal to, for example, the filler content of the insulating layer 13.

The wiring layer 26 is formed on the insulating layer 25 on its second side. The wiring layer 26 includes via interconnects 26*a* filling in via holes 25*x* piercing through the insulating layer 25 to expose the lower surface of the wiring layer 24; and a wiring pattern 26*b* formed on the lower surface of the insulating layer 25. The wiring pattern 26*b* is electrically connected to the wiring layer 24 via the via interconnects 26*a*. The via holes 25*x* may be recesses having the shape of a truncated cone, having an upper-side opening on the lower surface of the wiring layer 24 and a lower-side opening at the lower surface of the insulating layer 25. The lower-side opening is greater in diameter than the upper-side opening. The material of the wiring layer 26 and the thickness of the wiring pattern 26*b* may be equal to, for example, the material and the thickness, respectively, of the wiring layer 12.

The insulating layer 27 is so formed on the lower surface of the insulating layer 25 as to cover the wiring layer 26. The insulating layer 27 may be equal in material and thickness to, for example, the insulating layer 13. The insulating layer 27 may contain a filler such as silica. The filler content of the insulating layer 27 may be equal to, for example, the filler content of the insulating layer 13.

The wiring layer 28 is formed on the insulating layer 27 on its second side. The wiring layer 28 includes via interconnects 28*a* filling in via holes 27*x* piercing through the insulating layer 27 to expose the lower surface of the wiring layer 26; and a wiring pattern 28*b* formed on the lower surface of the insulating layer 27. The wiring pattern 28b is electrically connected to the wiring layer 26 via the via interconnects 28a. The via holes 27x may be recesses having the shape of a truncated cone, having an upper-side opening on the lower surface of the wiring layer 26 and a lower-side opening at the lower surface of the insulating layer 27. The lower-side opening is greater in diameter than the upper-side opening. The material of the wiring layer 28 and the thickness of the wiring pattern 28b may be equal to, for example, the material and the thickness, respectively, of the wiring layer 12.

The solder resist layer 29 is the outermost layer of the wiring substrate 1 on its second side, and is so formed on the lower surface of the insulating layer 27 as to cover the wiring layer 28. The solder resist layer 29 may be equal in material and thickness to, for example, the solder resist layer 19. The solder resist layer 29 includes openings 29x, and the lower surface of the wiring layer 28 is partly exposed in the openings 29x. The planar shape of the openings 29x may be, for example, circular. The wiring layer 28 exposed in the openings 29x may be used as pads for electrically connecting to a mounting board such as a motherboard (not depicted). The above-described metal layer may be formed or an anti-oxidation treatment such as an OSP process may be performed on the lower surface of the wiring layer 28 exposed in the openings 29x on an as-needed basis.

The insulating layers 15 and 17 may be thicker than the insulating layer 13 so that the electronic component 30 and the resin layer 33 can be buried in the insulating layers 15 and 17. In this case, the thickness of the insulating layers 25 and 27 is adjusted such that the insulating layers 25 and 27 are equal in thickness to the insulating layer 15 and 17, respectively.

[Method of Manufacturing Wiring Substrate]

Next, a method of manufacturing a wiring substrate according to the embodiment is described. FIGS. 2A through 2I are diagrams illustrating a process of manufacturing a wiring substrate according to the embodiment. Here, by way of example, a process of manufacturing a single wiring substrate is illustrated. Alternatively, however, the process may be adapted to manufacture a structure to become multiple wiring substrates and thereafter divide the structure into individual wiring substrates.

Figure 2A:
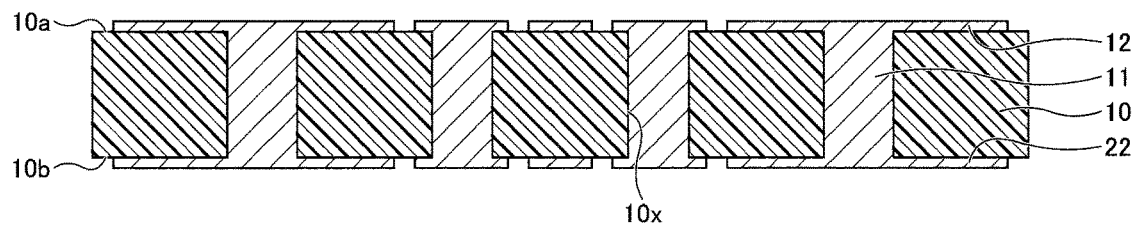
FIGS. 2A through 2I are diagrams illustrating a process of manufacturing a wiring substrate according to the embodiment.

First, in the process depicted in FIG. 2A, the through vias 11 are formed in and the wiring layers 12 and 22 are formed on the core layer 10. Specifically, for example, a laminated board having unpatterned plain copper foil formed on each of the first surface 10a and the second surface 10b of the core layer 10, which is a so-called glass epoxy substrate, is prepared. Then, in the prepared laminated board, the copper foil on each surface is thinned on an as-needed basis, and thereafter, the through holes 10x piercing through the core layer 10 and through the copper foil on each surface are formed by, for example, laser processing using a $CO_2$ laser.

Next, a desmear process is performed on an as-needed basis to remove the residual resin of the core layer 10 adhering to the inner wall surfaces of the through holes 10x. Then, a seed layer (for example, copper) covering the copper foil on each surface and the inner wall surfaces of the through holes 10x is formed by, for example, electroless plating or sputtering, and an electroplating layer (for example, copper) is formed on the seed layer by electroplating using the seed layer as a power feed layer. As a result, the through holes 10x are filled with the electroplating layer formed on the seed layer, and the wiring layers 12 and 22, each of which is a lamination of the copper foil, the seed layer, and the electroplating layer, are formed on the first surface 10a and the second surface 10b, respectively, of the core layer 10. Next, the wiring layers 12 and 22 are patterned into a predetermined shape by, for example, a subtractive process.

Figure 2B:
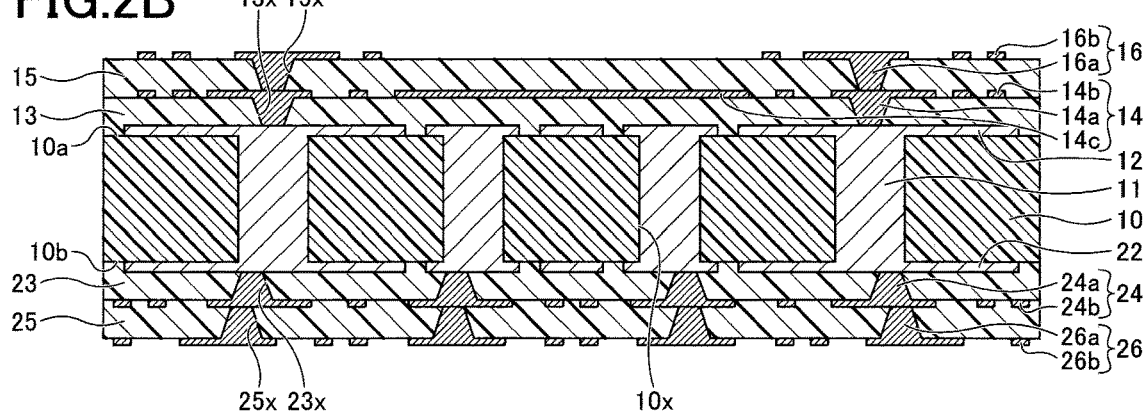

Next, in the process depicted in FIG. 2B, the first surface 10a of the core layer 10 is laminated with a semi-cured epoxy resin film such that the wiring layer 12 is covered with the semi-cured epoxy resin film, and the semi-cured epoxy resin film is cured to form the insulating layer 13. Furthermore, the second surface 10b of the core layer 10 is laminated with a semi-cured epoxy resin film such that the wiring layer 22 is covered with the semi-cured epoxy resin film, and the semi-cured epoxy resin film is cured to form the insulating layer 23. Alternatively, instead of laminating the first surface 10a and the second surface 10b with an epoxy resin film, epoxy resin liquid or paste may be applied to the first surface 10a and the second surface 10b and thereafter cured to form the insulating layers 13 and 23. Each of the insulating layers 13 and 23 may be, for example, approximately 30 µm to approximately 50 µm in thickness. Each of the insulating layers 13 and 23 may contain a filler such as silica.

Next, the via holes 13x piercing through the insulating layer 13 to expose the upper surface of the wiring layer 12 are formed in the insulating layer 13. Furthermore, the via holes 23x piercing through the insulating layer 23 to expose the lower surface of the wiring layer 22 are formed in the insulating layer 23. The via holes 13x and 23x may be formed by, for example, laser processing using a $CO_2$ laser. After formation of the via holes 13x and 23x, it is preferable to perform a desmear process to remove residual resin adhering to the surfaces of the wiring layers 12 and 22 exposed at the bottom of the via holes 13x and 23x, respectively.

Next, the wiring layer 14 is formed on the insulating layer 13 on its first side. The wiring layer 14 includes the via interconnects 14a filling in the via holes 13x, the wiring pattern 14b formed on the upper surface of the insulating layer 13, and the electronic component mounting pad 14c formed on the upper surface of the insulating layer 13. The material of the wiring layer 14 and the thickness of the wiring pattern 14b and the electronic component mounting pad 14c may be equal to, for example, the material and the thickness, respectively, of the wiring layer 12. The wiring layer 14 is electrically connected to the wiring layer 12 exposed at the bottom of the via holes 13x.

Furthermore, the wiring layer 24 is formed on the insulating layer 23 on its second side. The wiring layer 24 includes the via interconnects 24a filling in the via holes 23x and the wiring pattern 24b formed on the lower surface of the insulating layer 23. The material of the wiring layer 24 and the thickness of the wiring pattern 24b may be equal to, for example, the material and the thickness, respectively, of the wiring layer 12. The wiring layer 24 is electrically connected to the wiring layer 22 exposed at the bottom of the via holes 23x. The wiring layers 14 and 24 may be formed using a process among a variety of wiring forming processes, such as a semi-additive process or a subtractive process.

For example, in the case of forming the wiring layer 14 by a semi-additive process, the via holes 13x are formed in the insulating layer 13, and a seed layer is then formed on the surface of the insulating layer 13 including the inner wall surfaces of the via holes 13x and on the surface of the wiring layer 12 exposed in the via holes 13x by electroless plating of copper. Next, a plating resist pattern having an opening matching the shape of the wiring pattern 14b and the electronic component mounting pad 14c of the wiring layer 14 is formed on the seed layer, and an electroplating layer is deposited on the seed layer exposed in the openings of the plating resist pattern by electroplating of copper feeding power from the seed layer. Next, the plating resist pattern is removed, and etching is then performed using the electroplating layer as a mask to remove the seed layer exposed through the electroplating layer. As a result, the wiring layer 14 including the via interconnects 14a, the wiring pattern 14b and the electronic component mounting pad 14c can be obtained.

Next, the insulating layer 15 is so formed on the upper surface of the insulating layer 13 as to cover the wiring layer 14 by the same process as the insulating layer 13. The insulating layer 15 may be equal in material and thickness to, for example, the insulating layer 13. Then, the via holes 15x are formed by the same process as the via holes 13x. Then, the wiring layer 16 is formed on the insulating layer 15 on its first side by the same process as the wiring layer 14. The wiring layer 16 includes the via interconnects 16a filling in the via holes 15x and the wiring pattern 16b formed on the upper surface of the insulating layer 15. The material of the wiring layer 16 and the thickness of the wiring pattern 16b may be equal to, for example, the material and the thickness, respectively, of the wiring layer 12. The wiring layer 16 is electrically connected to the wiring layer 14 exposed at the bottom of the via holes 15x.

Furthermore, the insulating layer 25 is so formed on the lower surface of the insulating layer 23 as to cover the wiring layer 24 by the same process as the insulating layer 13. The insulating layer 25 may be equal in material and thickness to, for example, the insulating layer 13. Then, the via holes 25x are formed by the same process as the via holes 13x. Then, the wiring layer 26 is formed on the insulating layer 25 on its second side by the same process as the wiring layer 14. The wiring layer 26 includes the via interconnects 26a filling in the via holes 25x and the wiring pattern 26b formed on the lower surface of the insulating layer 25. The material of the wiring layer 26 and the thickness of the wiring pattern 26b may be equal to, for example, the material and the thickness, respectively, of the wiring layer 12. The wiring layer 26 is electrically connected to the wiring layer 24 exposed at the bottom of the via holes 25x.

Figure 2C:
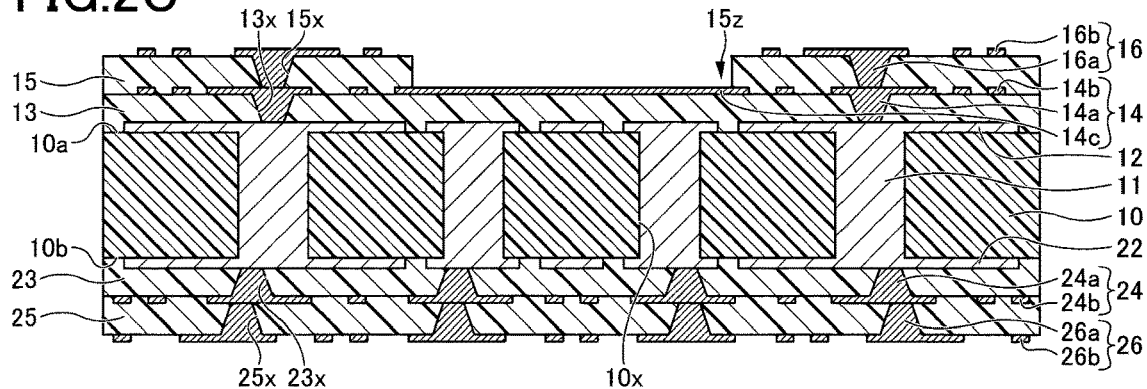

Next, in the process depicted in FIG. 2C, the cavity 15z exposing the upper surface of the electronic component mounting pad 14c is formed in the insulating layer 15. The planar shape of the cavity 15z may be, for example, rectangular. The cavity 15z may be formed by, for example, laser processing using a $CO_2$ laser.

Figure 2D:
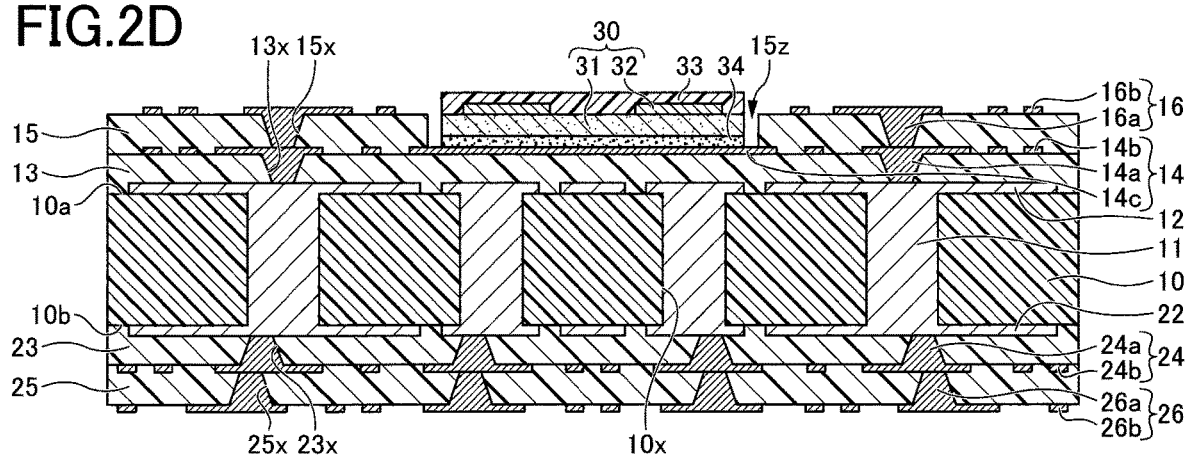

Next, in the process depicted in FIG. 2D, the electronic component 30 including the body 31 and the pads 32 is prepared, and the electronic component 30 is placed in the cavity 15z. The resin layer 33 covering the pads 32 is formed in advance on the upper surface of the electronic component 30, and the adhesive layer 34 is formed in advance on the lower surface of the electronic component 30. The method of forming the resin layer 33 on the upper surface of the electronic component 30 may be the same as the method of forming the insulating layer 13 on the core layer 10. The adhesive layer 34 may be formed on not the lower surface of the electronic component 30 but the electronic component mounting pad 14c exposed in the cavity 15z. In either case, the lower surface of the electronic component 30 is fixed onto the upper surface of the electronic component mounting pad 14c exposed in the cavity 15z via the adhesive layer 34.

In the process depicted in FIG. 2D, the resin layer 33 and the adhesive layer 34 are not cured, and the electronic component 30 is temporarily fixed in the cavity 15z.

Figure 2E:
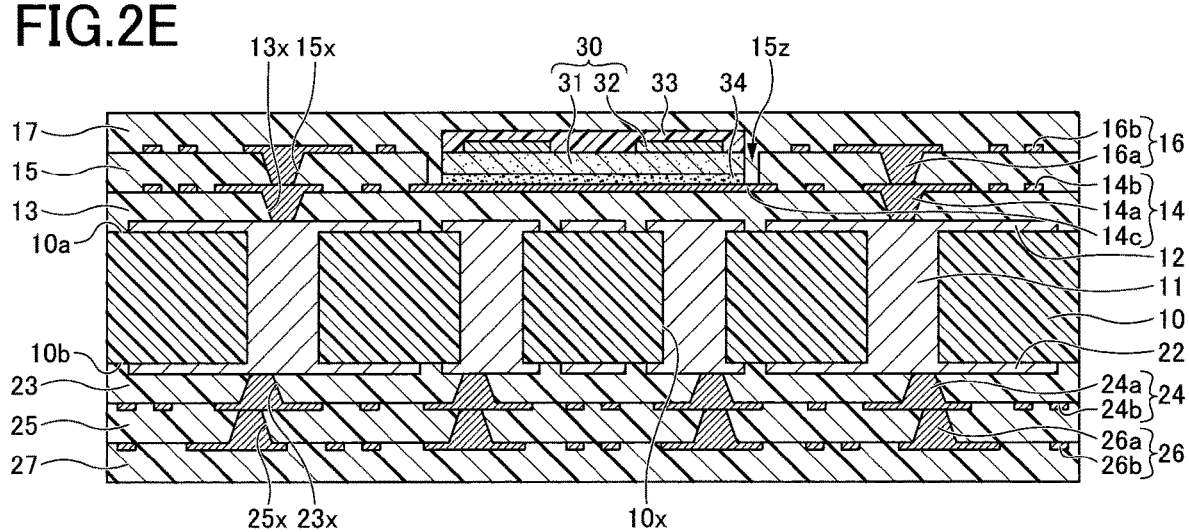

Next, in the process depicted in FIG. 2E, the insulating layer 17 is formed by laminating the upper surface of the insulating layer 15 with a semi-cured epoxy resin film such that the wiring layer 16 and the electronic component 30 on which the resin layer 33 is formed are covered with the semi-cured epoxy resin film. Furthermore, the insulating layer 27 is formed by laminating the lower surface of the insulating layer 25 with a semi-cured epoxy resin film such that the wiring layer 26 is covered with the semi-cured epoxy resin film. Alternatively, instead of forming a lamination of a semi-cured epoxy resin film, the insulating layers 17 and 27 may be formed by applying epoxy resin liquid or paste.

Then, while heating the insulating layers 17 and 27 thus formed, the upper surface of the insulating layer 17 and the lower surface of the insulating layer 27 are pressed toward the core layer 10 with parallel plates. At this point, the resin layer 33 and the adhesive layer 34 as well are heated. Therefore, the insulating layer 17, the insulating layer 27, the resin layer 33, and the adhesive layer 34 are cured substantially simultaneously. The thickness of each of the insulating layers 17 and 27 may be, for example, approximately 30 µm to approximately 40 µm. Each of the insulating layers 17 and 27 may contain a filler such as silica.

Figure 2F:
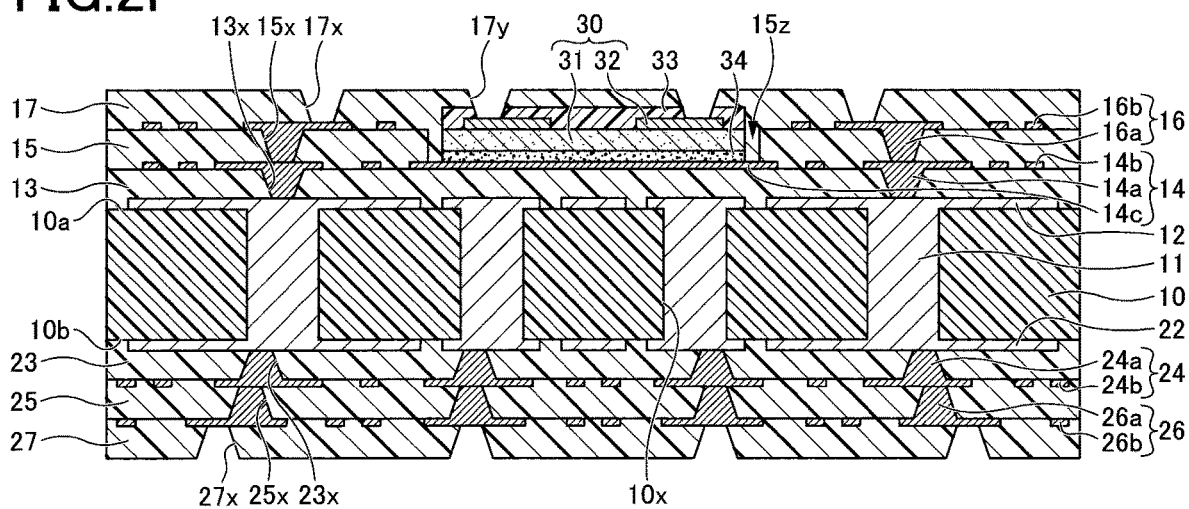

Next, in the process depicted in FIG. 2F, the via holes 17x piercing through the insulating layer 17 to expose the upper surface of the wiring layer 16 and the via holes 17y piercing through the insulating layer 17 and the resin layer 33 to expose the upper surfaces of the pads 32 of the electronic component 30 are formed. Furthermore, the via holes 27x piercing through the insulating layer 27 to expose the lower surface of the wiring layer 26 are formed in the insulating layer 27. The via holes 17x, 17y, and 27x may be formed by, for example, laser processing using a $CO_2$ laser. After formation of the via holes 17x, 17y, and 27x, it is preferable to perform a desmear process to remove residual resin adhering to the surface of the wiring layer 16, the surfaces of the pads 32, and the surface of the wiring layer 26 exposed at the bottom of the via holes 17x, 17y and 27x, respectively.

Figure 2G:
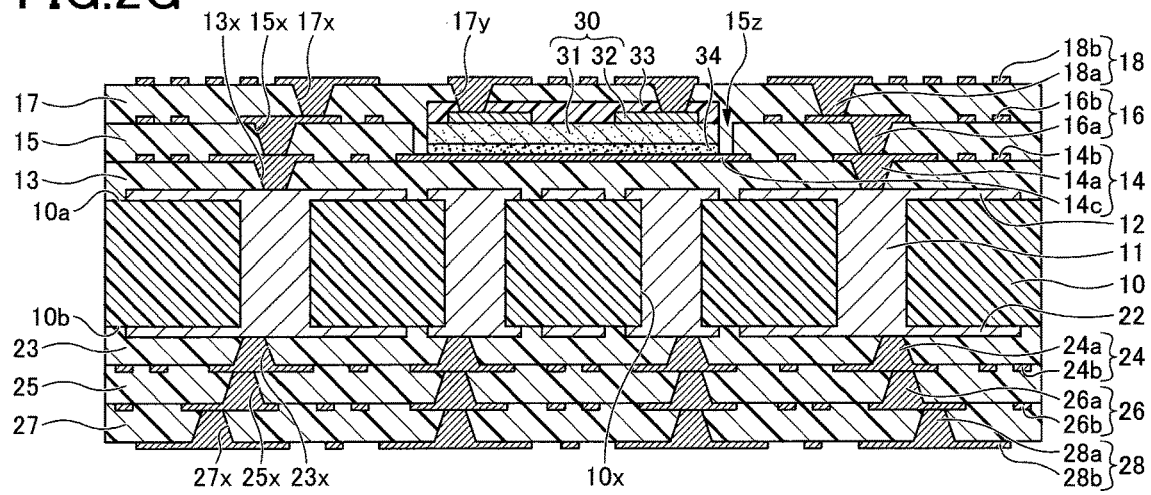

Next, in the process depicted in FIG. 2G, the wiring layer 18 is formed on the insulating layer 17 on its first side by the same process as the wiring layer 14. The wiring layer 18 includes the via interconnects 18a filling in the via holes 17x or 17y and the wiring pattern 18b formed on the upper surface of the insulating layer 17. The material of the wiring layer 18 and the thickness of the wiring pattern 18b may be equal to, for example, the material and the thickness, respectively, of the wiring layer 12. The wiring layer 18 is electrically connected to the wiring layer 16 exposed at the bottom of the via holes 17x and the pads 32 exposed at the bottom of the via holes 17y.

Furthermore, the wiring layer 28 is formed on the insulating layer 27 on its second side by the same process as the wiring layer 14. The wiring layer 28 includes the via interconnects 28a filling in the via holes 27x and the wiring pattern 28b formed on the lower surface of the insulating layer 27. The material of the wiring layer 28 and the thickness of the wiring pattern 28b may be equal to, for example, the material and the thickness, respectively, of the wiring layer 12. The wiring layer 28 is electrically connected to the wiring layer 26 exposed at the bottom of the via holes 27x.

Figure 2H:
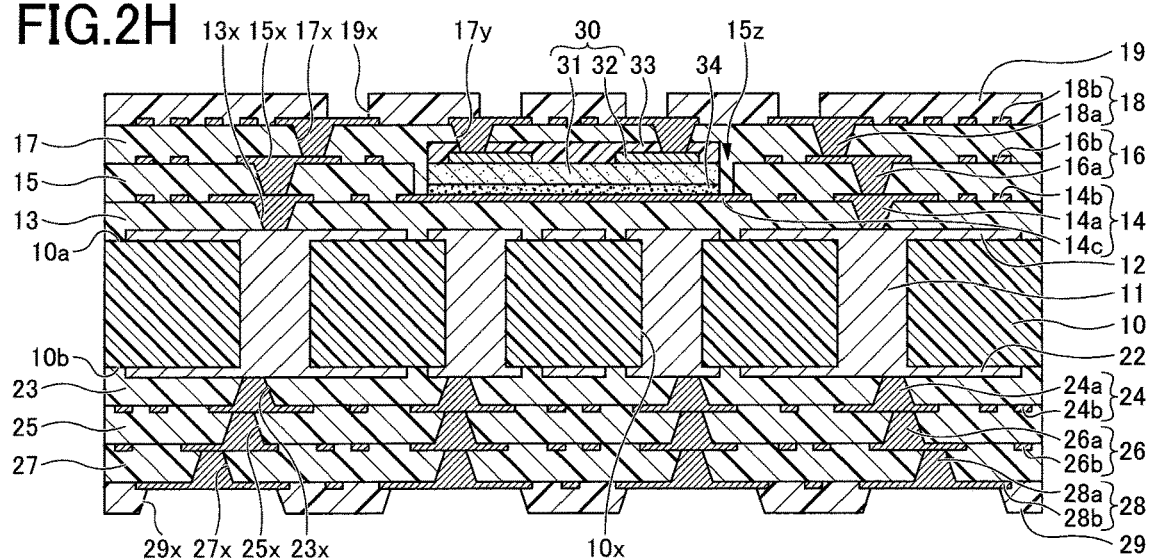

Next, in the process depicted in FIG. 2H, the solder resist layer 19 is so formed on the upper surface of the insulating layer 17 as to cover the wiring layer 18. Furthermore, the solder resist layer 29 is so formed on the lower surface of the insulating layer 27 as to cover the wiring layer 28. The solder resist layer 19 may be formed by, for example, applying a photosensitive epoxy or acrylic insulating resin in liquid or paste form onto the upper surface of the insulating layer 17 by a process such as screen printing, roll coating, or spin coating such that the wiring layer 18 is covered with the applied resin. Alternatively, the solder resist layer 19 may be formed by, for example, laminating the upper surface of the insulating layer 17 with a photosensitive epoxy or acrylic insulating resin film such that the wiring layer 18 is covered with the film. The solder resist layer 29 is formed by the same process as the solder resist layer 19.

Next, the solder resist layers 19 and 29 are exposed to light and developed to form the openings 19x partly exposing the upper surface of the wiring layer 18 and the openings 29x partly exposing the lower surface of the wiring layer 28 in the solder resist layers 19 and 29, respectively (photolithography). The openings 19x and 29x may alternatively be formed by laser processing or blasting. In this case, a photosensitive material does not have to be used for the solder resist layers 19 and 29. The planar shape of the openings 19x and the planar shape of the openings 29x may be, for example, circular. The diameter of the openings 19x and the diameter of the openings 29x may be designed as desired in accordance with connection targets (such as a semiconductor chip and a motherboard).

In this process, the above-described metal layer may be formed on the upper surface of the wiring layer 18 exposed at the bottom of the openings 19x and the lower surface of the wiring layer 28 exposed at the bottom of the openings 29x by, for example, electroless plating. Instead of forming the metal layer, it is possible to perform an anti-oxidation treatment such as an OSP process.

Figure 2I:
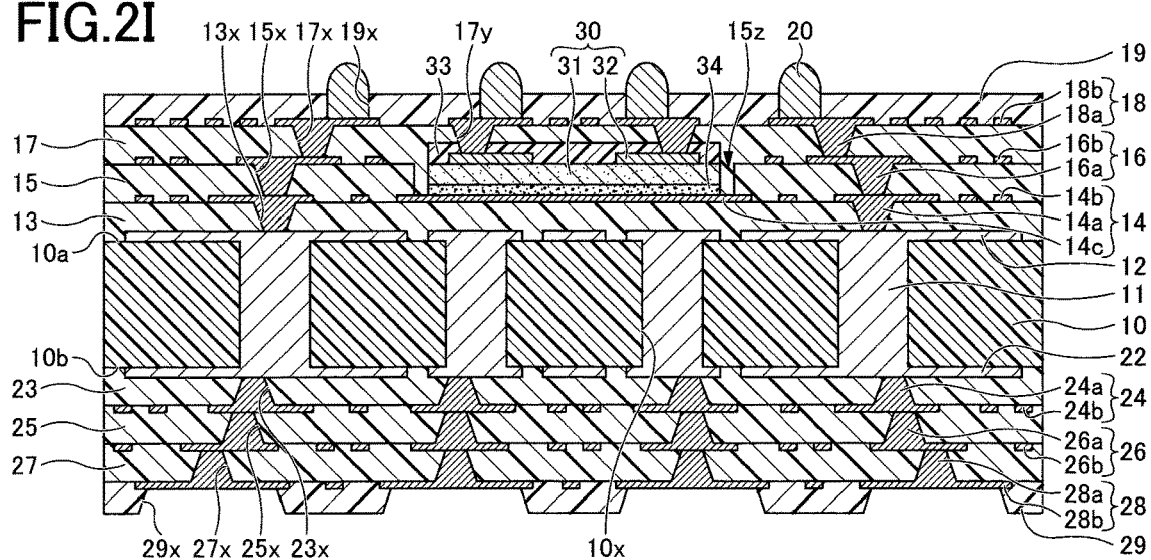

Next, in the process depicted in FIG. 2I, the external connection terminals 20 such as solder bumps are formed on the upper surface of the wiring layer 18 exposed at the bottom of the openings 19x. The external connection terminals 20 serve as terminals for electrically connecting to a semiconductor chip.

Here, an effect produced by forming the resin layer 33 on the upper surface of the electronic component 30 is described.

First, the case where the resin layer 33 is not formed on the upper surface of the electronic component 30 is discussed. In the process depicted in FIG. 2E, when the upper surface of the insulating layer 17 is pressed toward the core layer 10 with parallel plates while heating the insulating layer 17, the body 31 of the electronic component 30 and the adhesive layer 34 also are heated. At this point, because the CTE of the adhesive layer 34 is higher than the CTE of the body 31, the electronic component 30 warps convexly. In contrast, the upper surface of the insulating layer 17 is held flat with one of the parallel plates.

Next, when the pressure applied by the parallel plates is released, the insulating layer 17 as well warps convexly. The insulating layer 17, however, warps less than the electronic component 30 because the CTE of the insulating layer 17 is lower than the CTE of the adhesive layer 34. As a result, the insulating layer 17 covering the upper surface of the electronic component 30 becomes thinnest in the center and thicker toward the periphery on the electronic component 30. In this state, the insulating layer 17 and the adhesive layer 34 are cured.

When the via holes 17x and 17y are formed in this state, the via holes 17y become deeper and the bottom area of the via holes 17y (the area of the pad 32 exposed at the bottom of the via holes 17y) becomes smaller as the insulating layer 17 becomes thicker. As a result, the reliability of connection of the wiring pattern 18b and the pads 32 via the via holes 17y decreases toward the periphery on the electronic component 30.

In contrast, according to the wiring substrate 1, the resin layer 33, which is a warp correcting resin, is formed on the upper surface of the electronic component 30. As a result, forces are exerted in the resin layer 33 formed on the upper surface of the electronic component 30 and in the adhesive layer 34 formed on the lower surface of the electronic component 30 to warp the resin layer 33 and the adhesive layer 34 in opposite directions. Therefore, the warp of the electronic component 30 is corrected, so that the insulating layer 17 stacked on the resin layer 33 is substantially uniform in thickness regardless of a location in the insulating layer 17. Therefore, the depth of the via holes 17y and the bottom area of the via holes 17y (namely, the area of the pad 32 exposed at the bottom of the via holes 17y) as well are substantially uniform regardless of their locations in the insulating layer 17. As a result, the bottom area of the via holes 17y is prevented from being extremely small. Therefore, it is possible to increase the reliability of connection of the wiring pattern 18b and the pads 32 via the via holes 17y.

The insulating layer 17, the resin layer 33, and the adhesive layer 34 are thermally cured substantially simultaneously. Therefore, the thermal cure shrinking force of the resin layer 33 is preferably greater than the thermal cure shrinking force of each of the insulating layer 17 and the adhesive layer 34. As a result, the thermal cure shrinking force of the resin layer 33 counteracts the thermal cure shrinking forces of the insulating layer 17 and the adhesive layer 34.

Accordingly, it is possible to minimize the warp of the electronic component 30. A thermal cure shrinking force is a shrinking force generated in a material that thermally cures to shrink when the material thermally cures, and is determined by the CTE and the volume of the material. The CTE of the resin layer 33 is higher than the CTE of each of the insulating layer 17 and the adhesive layer 34.

Variation of Embodiment

A variation of the embodiment is different from the embodiment in the shape of a warp correcting resin layer. In the following description of the variation, a description of the same elements or components as those of the above-described embodiment may be omitted.

Figure 3:
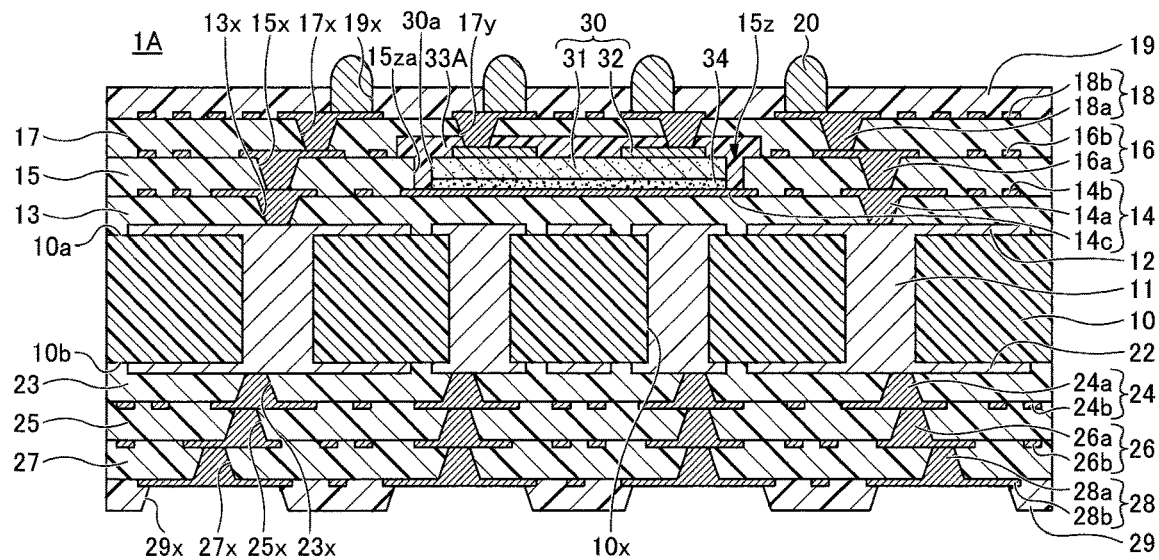
FIG. 3 is a sectional view of a wiring substrate according to a variation of the embodiment.

FIG. 3 is a sectional view of a wiring substrate 1A according to the variation. Referring to FIG. 3, the wiring substrate 1A is different from the wiring substrate 1 (see FIG. 1) in that the resin layer 33 is replaced with a resin layer 33A.

The resin layer 33A covers the upper surface of the electronic component 30, fills in the gap formed between the sidewall 15za of the cavity 15z and the electronic component 30, and further extends onto the upper surface of the insulating layer 15 around the cavity 15z. The insulating layer 17 is so formed on the upper surface of the insulating layer 15 as to cover the wiring layer 16 and the resin layer 33A.

The resin layer 33A is a warp correcting resin that prevents the warping of the electronic component 30. Suitable materials for the resin layer 33A include, for example, an insulating resin whose principal component is an epoxy resin or a polyimide resin. The thickness of the resin layer 33A may be, for example, approximately 30 µm to approximately 40 µm. The resin layer 33A may contain a filler such as silica.

The filler content of the resin layer 33A is preferably adjusted to be smaller than the filler content of the insulating layer 17. This makes the CTE of the resin layer 33A higher than the CTE of the insulating layer 17. For example, when the filler content of the insulating layer 17 is 80% to 90% and the CTE of the insulating layer 17 is 20 ppm/° C. to 50 ppm/° C., the filler content of the resin layer 33A may be adjusted to be less than 80% to make the CTE of the resin layer 33A greater than 50 ppm/° C. An optimum value may be selected as a specific adjusted value while determining the degree of warping of the electronic component 30. Regarding how much the resin layer 33A extends onto the upper surface of the insulating layer 15 around the cavity 15z, an optimum value may be selected while determining the degree of warping of the electronic component 30.

Figure 4A:
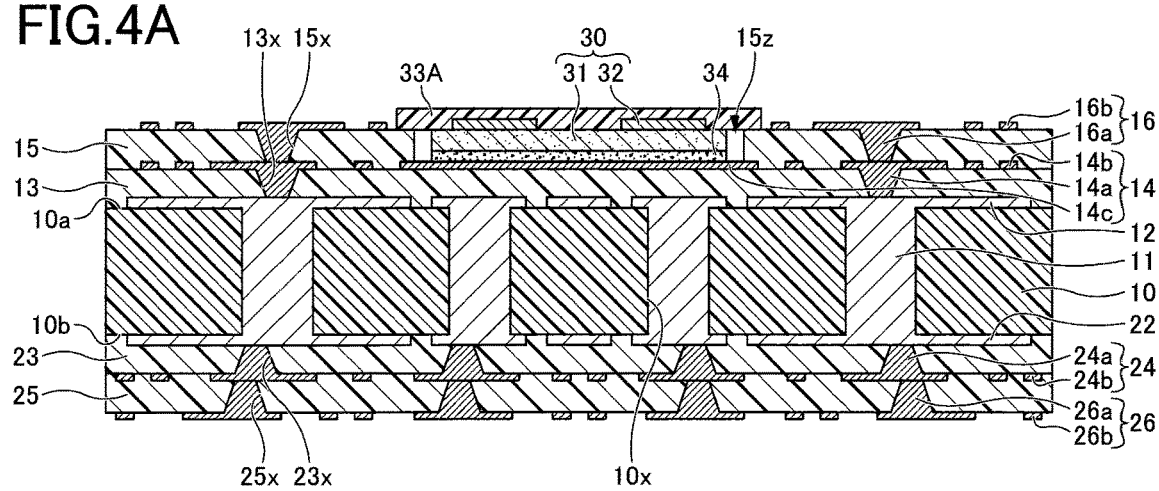
FIGS. 4A and 4B are diagrams illustrating a process of manufacturing a wiring substrate according to the variation.

To form the resin layer 33A, after the process depicted in FIG. 2D of the above-described embodiment (without forming the resin layer 33 on the electronic component 30), a lamination of a semi-cured epoxy resin film is so provided as to cover the upper surface of the electronic component 30 and the upper surface of the insulating layer 15 around the cavity 15z as illustrated in FIG. 4A.

Figure 4B:
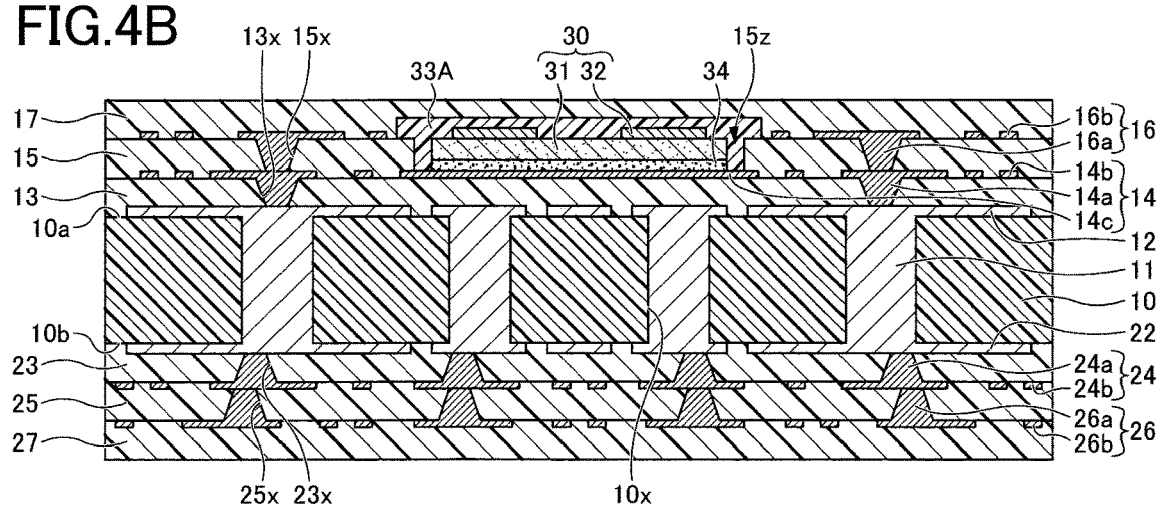

Next, as illustrated in FIG. 4B, the same as in the process of FIG. 2E, the insulating layer 17 is formed by laminating the upper surface of the insulating layer 15 with a semi-cured epoxy resin film such that the wiring layer 16 and the resin layer 33A are covered with the film. Furthermore, the insulating layer 27 is formed by laminating the lower surface of the insulating layer 25 with a semi-cured epoxy resin film such that the wiring layer 26 is covered with the film. Alternatively, instead of forming a lamination of a semi-cured epoxy resin film, the insulating layers 17 and 27 may be formed by applying epoxy resin liquid or paste.

Then, while heating the insulating layers 17 and 27 thus formed, the upper surface of the insulating layer 17 and the lower surface of the insulating layer 27 are pressed toward the core layer 10 with parallel plates. At this point, the resin layer 33A and the adhesive layer 34 as well are heated. Therefore, the insulating layer 17, the insulating layer 27, the resin layer 33A, and the adhesive layer 34 are cured substantially simultaneously. Furthermore, during cure, the resin layer 33A softens to fill in the gap formed between the sidewall 15za of the cavity 15z and the electronic component 30. Thereafter, the same processes as in FIGS. 2F through 2I are executed to complete the wiring substrate 1A (see FIG. 3).

In the process of FIG. 4A, instead of a lamination of a semi-cured epoxy resin film, epoxy resin liquid or paste may be applied as the resin layer 33A.

In the case of thus using the resin layer 33A in place of the resin layer 33 as well, the warp of the electronic component 30 is corrected, so that the insulating layer 17 stacked on the resin layer 33A is substantially uniform in thickness regardless of a location in the insulating layer 17. Therefore, the depth of the via holes 17y and the bottom area of the via holes 17y (namely, the area of the pad 32 exposed at the bottom of the via holes 17y) as well are substantially uniform regardless of their locations in the insulating layer 17. As a result, the bottom area of the via holes 17y is prevented from being extremely small. Therefore, it is possible to increase the reliability of connection of the wiring pattern 18b and the pads 32 via the via holes 17y.

The insulating layer 17, the resin layer 33A, and the adhesive layer 34 are thermally cured substantially simultaneously. Therefore, the thermal cure shrinking force of the resin layer 33A is preferably greater than the thermal cure shrinking force of each of the insulating layer 17 and the adhesive layer 34. As a result, the thermal cure shrinking force of the resin layer 33A counteracts the thermal cure shrinking forces of the insulating layer 17 and the adhesive layer 34. Accordingly, it is possible to minimize the warp of the electronic component 30. The thermal cure shrinking force is determined by the CTE and the volume of a material that thermally cures to shrink. The CTE of the resin layer 33A is higher than the CTE of each of the insulating layer 17 and the adhesive layer 34.

Application of Embodiment

An application of the embodiment is a semiconductor package in which a semiconductor chip is mounted on a wiring substrate according to the embodiment. In the following description of the application, a description of the same elements or components as those of the above-described embodiment may be omitted.

Figure 5:
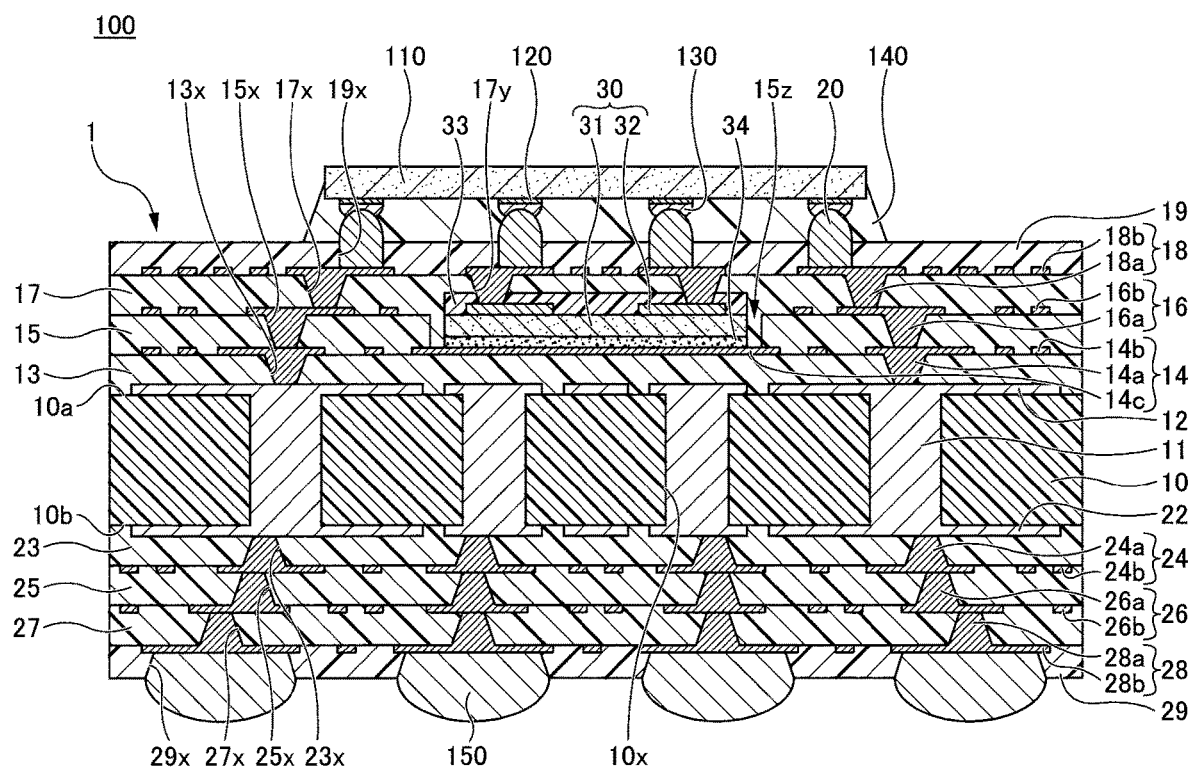
FIG. 5 is a sectional view of a semiconductor package according to an application of the embodiment.

FIG. 5 is a sectional view of a semiconductor package 100 according to the application. Referring to FIG. 5, the semiconductor package 100 includes the wiring substrate 1 illustrated in FIG. 1, a semiconductor chip 110, electrode pads 120, bumps 130, an underfill resin 140, and bumps 150.

The semiconductor chip 110 includes, for example, a thinned semiconductor substrate of, for example, silicon (not depicted) and a semiconductor integrated circuit (not depicted) formed on the semiconductor substrate. The electrode pads 120 electrically connected to the semiconductor integrated circuit are formed on the semiconductor substrate.

The bumps 130 are formed on the electrode pads 120 formed on the semiconductor chip 110 to be electrically connected to the external connection terminals 20 of the wiring substrate 1. The underfill resin 140 fills in a gap between the semiconductor chip 110 and the upper surface of the wiring substrate 1. The bumps 150 are formed on the lower surface of the wiring layer 28 exposed at the bottom of the openings 29x of the solder resist layer 29. The bumps 150 are connected to, for example, a motherboard. The bumps 130 and 150 are, for example, solder bumps. Suitable materials for solder bumps include, for example, alloys containing Pb, Sn—Cu alloys, Sn—Ag alloys, and Sn—Ag—Cu alloys.

Thus, by mounting a semiconductor chip on a wiring substrate according to the above-described embodiment, it is possible to achieve a semiconductor package. The wiring substrate 1 may be replaced with the wiring substrate 1A.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, while the above-described embodiment illustrates the case of applying the present invention to a wiring substrate with a core layer manufactured by a build-up process, the present invention may also be applied to a coreless wiring substrate manufactured by a build-up process. Furthermore, the present invention is not limited to these, and may be applied to various wiring substrates.

Various aspects of the subject-matter described herein may be set out non-exhaustively in the following numbered clauses:

1. A method of manufacturing a wiring substrate, the method including:
   forming a cavity in a first insulating layer;
   forming a resin layer on a first surface of an electronic component such that the resin layer covers a pad formed at the first surface;
   fixing a second surface of the electronic component in the cavity via an adhesive layer, the second surface facing away from the first surface;
   forming a second insulating layer on the first insulating layer such that the second insulating layer covers the resin layer;
   thermally curing the resin layer, the adhesive layer, and the second insulating layer simultaneously;
   forming a via hole through the second insulating layer and the resin layer such that the via hole exposes the pad; and
   forming a wiring pattern on the second insulating layer such that the wiring pattern is electrically connected to the pad via a via interconnect formed in the via hole.

2. A method of manufacturing a wiring substrate, the method including:
   forming a cavity in a first insulating layer;
   fixing a first surface of an electronic component in the cavity via an adhesive layer, the electronic component including a second surface at which a pad is formed, the second surface facing away from the first surface;
   forming a resin layer on the first insulating layer such that the resin layer covers the second surface of the electronic component, fills in a gap formed between a sidewall of the cavity and the electronic component, and extends onto a surface of the first insulating layer around the cavity;
   forming a second insulating layer on the first insulating layer such that the second insulating layer covers the resin layer;
   thermally curing the resin layer, the adhesive layer, and the second insulating layer simultaneously;
   forming a via hole through the second insulating layer and the resin layer such that the via hole exposes the pad; and
   forming a wiring pattern on the second insulating layer such that the wiring pattern is electrically connected to the pad via a via interconnect formed in the via hole.

3. The method of clause 1 or 2, wherein a thermal cure shrinking force of the resin layer is greater than a thermal cure shrinking force of each of the second insulating layer and the adhesive layer.

What is claimed is:
1. A wiring substrate comprising:
   a first insulating layer including a cavity;
   an electronic component including a first surface at which a pad is formed and a second surface facing away from the first surface and fixed in the cavity via an adhesive layer;
   a resin layer on the first surface of the electronic component, the resin layer covering the pad;
   a second insulating layer on the first insulating layer, the second insulating layer covering the resin layer;
   a wiring pattern on the second insulating layer; and
   a via interconnect piercing through the second insulating layer and the resin layer to electrically connect the wiring pattern to the pad,
   wherein a part of the second insulating layer fills in a gap formed between a sidewall of the cavity and the electronic component.

2. The wiring substrate as claimed in claim 1, wherein a coefficient of thermal expansion of the resin layer is higher than a coefficient of thermal expansion of each of the second insulating layer and the adhesive layer.

3. The wiring substrate as claimed in claim 1, wherein the via interconnect fills in a single via hole piercing, through the second insulating layer and the resin layer.

4. The wiring substrate as claimed in claim 1, further comprising;
   a solder resist layer on the second insulating layer, the solder resist layer covering the wiring pattern and including an opening that exposes a part of the wiring pattern; and
   an external connection terminal on the exposed part of the wiring pattern in the opening.

5. A semiconductor package comprising:
   the wiring substrate as set forth in claim 4; and
   a semiconductor chip including an electrode, the semiconductor chip being mounted on the wiring substrate with the electrode being connected to the external connection terminal.

* * * * *